(12) United States Patent
Nam et al.

(10) Patent No.: US 9,478,591 B2
(45) Date of Patent: Oct. 25, 2016

(54) ORGANIC LIGHT EMITTING DISPLAY DEVICE AND REPAIR METHOD THEREOF

(71) Applicant: LG DISPLAY CO., LTD., Seoul (KR)

(72) Inventors: Kyoungjin Nam, Paju-si (KR); Soyoung Noh, Goyang-si (KR); Gisang Hong, Goyang-si (KR); Seonhui Hwang, Paju-si (KR); Jeongoh Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/575,435

(22) Filed: Dec. 18, 2014

(65) Prior Publication Data

US 2015/0179719 A1     Jun. 25, 2015

(30) Foreign Application Priority Data

Dec. 23, 2013   (KR) .................. 10-2013-0161318
Nov. 7, 2014    (KR) .................. 10-2014-0154589

(51) Int. Cl.
  *H01L 27/32*   (2006.01)
  *H01L 51/50*   (2006.01)
  *H01L 51/52*   (2006.01)

(52) U.S. Cl.
  CPC ....... *H01L 27/3246* (2013.01); *H01L 27/3258* (2013.01); *H01L 51/5212* (2013.01); *H01L 51/5228* (2013.01)

(58) Field of Classification Search
  CPC ........... H01L 27/3241; H01L 27/3244; H01L 27/3258; H01L 27/3276; H01L 27/3279; H01L 27/3246; H01L 51/5212; H01L 51/5228

See application file for complete search history.

(56) References Cited

U.S. PATENT DOCUMENTS 7,211,947 B2 *   5/2007   Kim ................... H01L 51/5206
                                              313/504
7,956,351 B2 *   6/2011   Choi .................. H01L 27/3246
                                              257/40

(Continued)

*Primary Examiner* — Michele Fan
(74) *Attorney, Agent, or Firm* — Birch, Stewart, Kolasch & Birch, LLP

(57) ABSTRACT

An organic light emitting display device can include a substrate, two or more first electrodes positioned on the substrate and spaced apart from one another, an auxiliary electrode positioned between the first electrodes, a barrier rib positioned on the auxiliary electrode and having a reversely tapered structure including at least two layers, a bank layer exposing portions of the first electrodes to define a light emission region, an organic layer positioned in the light emission region and patterned by the barrier rib, and a second electrode positioned on the organic layer and the barrier rib and disposed to be in contact with the auxiliary electrode.

20 Claims, 8 Drawing Sheets

(56) References Cited

U.S. PATENT DOCUMENTS

| | | | |
|---|---|---|---|
| 2006/0119260 A1* | 6/2006 | Kim | H01L 27/3246 313/506 |
| 2007/0152570 A1* | 7/2007 | Jung | H01L 27/3251 313/504 |
| 2008/0049155 A1* | 2/2008 | Yagi | G02F 1/136259 349/39 |
| 2009/0009069 A1* | 1/2009 | Takata | H01L 27/3246 313/504 |
| 2012/0161167 A1* | 6/2012 | Yamazaki | H01L 27/3283 257/88 |
| 2012/0187389 A1* | 7/2012 | Shoda | H01L 27/3246 257/40 |
| 2012/0228603 A1* | 9/2012 | Nakamura | H01L 27/322 257/40 |
| 2013/0069067 A1* | 3/2013 | Youn | H01L 27/3279 257/59 |
| 2013/0299791 A1* | 11/2013 | Hirakata | H01L 51/5228 257/40 |
| 2014/0183479 A1* | 7/2014 | Park | H01L 51/56 257/40 |
| 2014/0239262 A1* | 8/2014 | Kim | H01L 51/5212 257/40 |
| 2014/0312323 A1* | 10/2014 | Park | H01L 51/525 257/40 |
| 2014/0312329 A1* | 10/2014 | Fujii | H01L 51/5228 257/40 |
| 2014/0346459 A1* | 11/2014 | Song | H01L 51/5228 257/40 |
| 2015/0014658 A1* | 1/2015 | Choung | H01L 51/5203 257/40 |
| 2015/0243934 A1* | 8/2015 | Han | H01L 51/56 438/34 |
| 2016/0126458 A1* | 5/2016 | Hiraoka | C09K 11/06 257/40 |

* cited by examiner

ORGANIC LIGHT EMITTING DISPLAY DEVICE AND REPAIR METHOD THEREOF

This application claims the priority benefit of Korean Patent Application Nos. 10-2013-0161318 filed in the Republic of Korea on Dec. 23, 2013 and 10-2014-0154589 filed on Nov. 7, 2014, which are incorporated herein by reference for all purposes as if fully set forth herein.

BACKGROUND OF THE INVENTION

1. Field of the Invention

The present invention relates to an organic light emitting display device and a repair method thereof, and more particularly, to an organic light emitting display device and a repair method thereof capable of simplifying a manufacturing process, reducing resistance of a second electrode, and repairing non-uniform brightness.

2. Discussion of the Related Art

Recently, various flat display devices capable of reducing a heavy weight and volume, and the shortcomings of cathode ray tubes (CRTs), have been developed. Flat display devices include, for example, a liquid crystal display (LCD), a field emission display (FED), a plasma display panel (PDP), an organic light emitting display (OLED), and the like. An organic light emitting display is a self-luminescence display that emits light by exciting an organic compound. Eliminating the necessity of a backlight light such as required in LCDs, an organic light emitting display may be lighter and thinner and allow for simplification of processes. In addition, organic light emitting displays are manufactured at low temperatures, have a high response speed of 1 ms or less, and exhibit characteristics such as low power consumption, a wide viewing angle, high contrast, and the like.

In an organic light emitting display device in which a light emitting layer formed of an organic material is provided between a first electrode as an anode and a second electrode as a cathode, holes supplied from the first electrode and electrons received from the second electrode are combined in the light emitting layer to form excitons, electron-hole pairs, and as the excitons are restored to a ground state, energy is generated to emit light. Organic light emitting display devices may be classified as a bottom emission type organic light emitting display device and a top emission type organic light emitting display device depending on the direction in which light is output. The bottom emission-type organic light emitting display device refers to an organic light emitting display device in which light is output in a downward direction of a substrate, namely, from a light emitting layer toward a first electrode, and the top emission-type organic light emitting display device refers to an organic light emitting display device in which light is output in an upward direction of a substrate, namely, from a light emitting layer toward a second electrode.

However, in the top emission-type organic light emitting display device, since the second electrode, a metal, is formed to be very thin to allow light to be transmitted therethrough, resistance of the second electrode increases, degrading device efficiency. In addition, since the light emitting layer of the organic light emitting display device is deposited using a fine metal mask (FMM), manufacturing cost of the mask increases and a manufacturing process of the light emitting layer is complicated.

SUMMARY OF THE INVENTION

An aspect of the present invention provides an organic light emitting display device and a repair method thereof capable of simplifying a manufacturing process, reducing resistance of a second electrode, and repairing non-uniform brightness.

In an embodiment, an organic light emitting display device comprises, a substrate, two or more first electrodes positioned on the substrate and spaced apart from one another, an auxiliary electrode positioned between the first electrodes, a barrier rib positioned on the auxiliary electrode and having a reversely tapered structure including at least two layers, a bank layer exposing portions of the first electrodes to define a light emission region, an organic layer positioned in the light emission region and patterned by the barrier rib, and a second electrode positioned on the organic layer and the barrier rib and disposed to be in contact with the auxiliary electrode.

In an embodiment, an organic light emitting display device comprises, a substrate, two or more first electrodes positioned on the substrate and spaced apart from one another, an auxiliary electrode positioned between the first electrodes, a barrier rib positioned on the auxiliary electrode and including at least two layers, a bank layer exposing portions of the first electrodes to define a light emission region, an organic layer positioned in the light emission region and patterned by the barrier rib, and a second electrode continuously positioned on the organic layer and the barrier rib and disposed to be in contact with the auxiliary electrode.

In an embodiment, a method is provided for repairing an organic light emitting display device including a substrate, two or more first electrodes positioned on the substrate and spaced apart from one another, an auxiliary electrode positioned between the first electrodes, a barrier rib positioned on the auxiliary electrode and having a reversely tapered structure including at least two layers, a bank layer exposing portions of the first electrodes to define a light emission region, an organic layer positioned in the light emission region and patterned by the barrier rib, and a second electrode positioned on the organic layer, spaced apart from the barrier rib, and disposed to be in contact with the auxiliary electrode, the method comprising, irradiating a laser to the barrier rib to melt portions of the barrier rib and the second electrode positioned on the barrier rib, and forming the second electrode such that the second electrode continues from an upper surface of the organic layer to an upper surface of the barrier rib.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
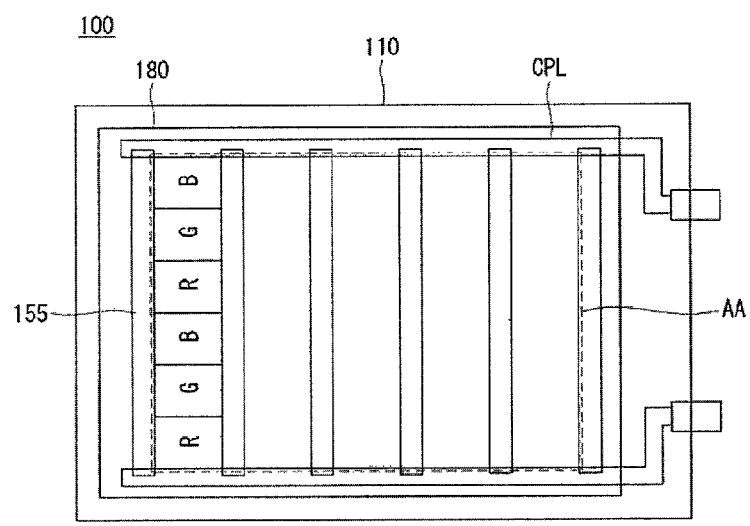
FIG. 1 is a plan view illustrating an organic light emitting display device according to an embodiment of the present invention.
Figure 2:
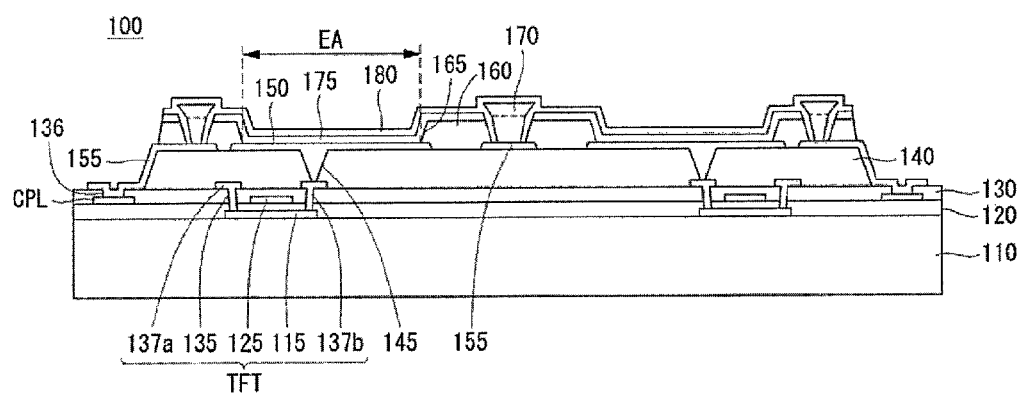
FIG. 2 is a cross-sectional view illustrating the organic light emitting display device according to an embodiment of the present invention.

FIG. 1 is a plan view illustrating an organic light emitting display device according to an embodiment of the present invention, and FIG. 2 is a cross-sectional view illustrating the organic light emitting display device according to an embodiment of the present invention.

Referring to FIG. 1, in an organic light emitting display device 100 according to an embodiment of the present invention, an active area AA is demarcated in a substrate 110, and an image is implemented through the active area AA. The active area AA includes a plurality of red (R), green (G), and blue (B) pixels, and emission of light from the plurality of pixels is adjusted by a scan signal and a data signal. The plurality of pixels each include a first electrode as an anode electrode connected to a thin film transistor and a second electrode 180 as a cathode electrode facing the first electrode. Cathode power lines CPL supplying a low potential voltage to the second electrode 180 are positioned on both sides of the active region AA, and the second electrode 180 having a small thickness is formed on the entire surface of the active region AA and connected to the cathode power lines CPL.

In an embodiment of the present invention, the organic light emitting display device 100 further includes auxiliary electrodes 155 in order to prevent resistance of the second electrode 180 from being increased. In more detail, the auxiliary electrodes 155 are formed between the plurality of pixels in a direction intersecting the cathode power lines CPL. As illustrated, one auxiliary line 155 may be formed between pixels, but the present invention is not limited thereto and one auxiliary line 155 may be formed between every two pixels or every three or more pixels. The auxiliary electrodes 155 are connected to the cathode power lines CPL at both ends thereof, and are connected in the form of a line to the second electrode 180. Thus, the auxiliary electrodes 155 may reduce resistance of the second electrode 180, preventing non-uniform brightness of the display device.

The organic light emitting display device 100 according to an embodiment of the present invention includes a plurality of pixels, but hereinafter, two subpixels will be described as an example for the purposes of description.

Referring to FIG. 2, in the organic light emitting display device 100 according to an embodiment of the present invention, a semiconductor layer 115 is positioned on a substrate 110 and a gate insulating layer 120 is positioned on the semiconductor layer 115. A gate electrode 125 is positioned on the gate insulating layer 120 such that the gate electrode 125 corresponds to the semiconductor layer 115, and the cathode power lines CPL are positioned on both sides of the substrate 110. An interlayer insulating layer 130 is positioned on the gate electrode 125 and the cathode power lines CPL, and a source electrode 137*a* and a drain electrode 137*b* are positioned on the interlayer insulating layer 130. The source electrode 137*a* and the drain electrode 137*b* are connected to the semiconductor layer 115 via first contact holes 135 penetrating through the interlayer insulating layer 130 and the gate insulating layer 120. Accordingly, a thin film transistor TFT including the semiconductor layer 115, the gate electrode 125, the source electrode 137*a*, and the drain electrode 137*b* is formed.

A planarization layer 140 is positioned on the TFT, and first electrodes 150 and the auxiliary electrodes 155 are positioned on the planarization layer 140. The first electrode 150 is connected to the drain electrode 137*b* of the TFT via a via hole 145 penetrating through the planarization layer 140. The auxiliary electrodes 155 are positioned between the first electrodes 150 spaced apart from one another, so as to be positioned to be spaced apart from the first electrodes 150. Also, the auxiliary electrodes 155 positioned on both sides of the substrate 110 are formed along the planarization layer 140 and connected to the cathode power lines CPL via second contact holes 136 penetrating through the interlayer insulating layer 130.

A bank layer 160 is positioned on the first electrodes 150 and the auxiliary electrodes 155. The bank layer 160 includes openings 165 exposing the first electrodes 150, defining a pixel and an emission area EA. Also, the bank layer 160 exposes the auxiliary electrodes 155 via the openings 165. Barrier ribs 170 are positioned on the auxiliary electrodes 155. The barrier ribs 170 positioned on the auxiliary electrodes 155 may have a reversely tapered shape and spaced apart from one another. Details of the barrier ribs 170 will be described hereinafter.

An organic layer 175 is formed on the substrate 110 with the first electrode 150, the bank layer 160, and the barrier rib 170 formed thereon. The organic layer 175 is deposited on the first electrode 150, the bank layer 160, and the barrier rib 170 and patterned by the barrier rib 170 such that the organic layer 175 is not deposited on the auxiliary electrode 155. The second electrode 180 is positioned on the organic layer 175. The second electrode 180 is stacked on the entire surface of the substrate 110 and also on the auxiliary electrode 155 positioned below the barrier rib 170. Namely, the second electrode 180 is continuously formed on the entire surface of the substrate 100 without being patterned. Thus, since the second electrode 180 is electrically connected to the auxiliary electrode 155 positioned therebelow, resistance is reduced by the auxiliary electrode. Thus, by forming the auxiliary electrode for the second electrode having high resistance in the related art, resistance of the second electrode may be reduced, a driving voltage of an element can be lowered to facilitate increasing a size of the device, and generation of non-uniform brightness otherwise due to a non-uniform voltage based on resistance can be prevented.

Figure 3:
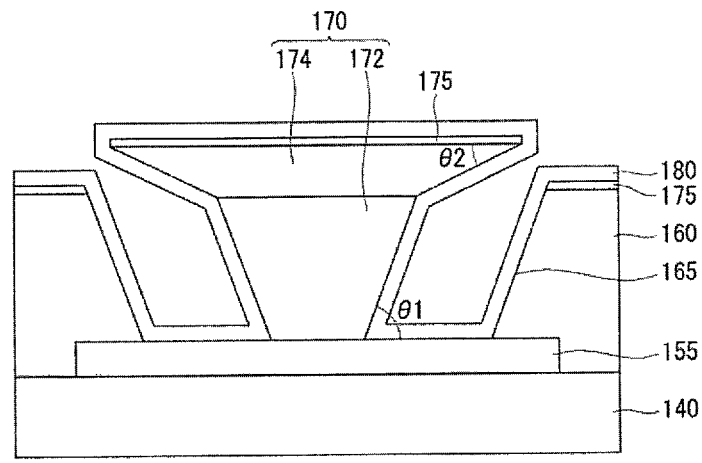
FIGS. 3 and 4 are cross-sectional views illustrating barrier ribs according to embodiments of the present invention.
Figure 4:
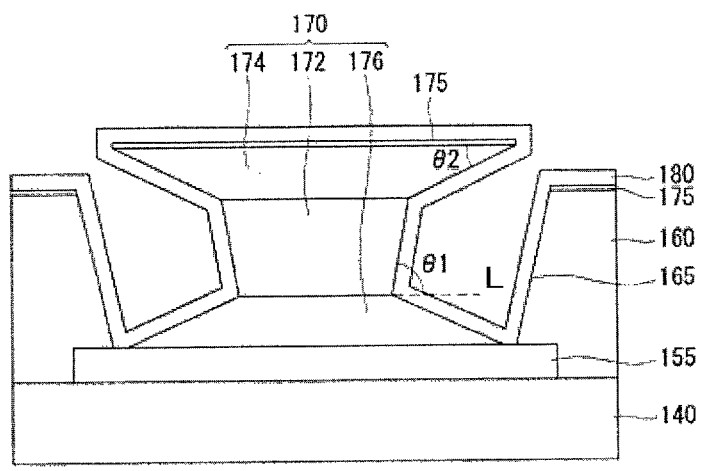

FIGS. 3 and 4 are cross-sectional views illustrating barrier ribs according to embodiments of the present invention. Referring to FIG. 3, the barrier rib 170 according to an embodiment of the present invention is positioned on the auxiliary electrode 155 and has a dual-layer structure including a first layer 172 positioned on the auxiliary electrode 155 and positioned in a lower portion and a second layer 174 positioned on the first layer 172. The first layer 172 of the barrier rib 170, which is in direct contact with the auxiliary electrode 155 to form a lower portion of the barrier rib 170, is formed of any one selected from among ITO, ITZO, IO, SnO, ZnO, ISnO, IZO, IGO, GZO, and IGZO. The second layer 174 of the barrier rib 170, which is positioned on the first layer 172 to form an upper portion of the barrier rib 170, is formed of any one selected from among ITO, ITZO, IO, SnO, ZnO, ISnO, IZO, IGO, GZO, and IGZO. In this instance, the second layer 174 is formed of a material different from that of the first layer 172.

In more detail, the barrier rib 170 has a reversely tapered shape, and thus, the first layer 172 is formed of a material having an etching rate higher than that of the second layer 174 with respect to the same etching solution, and the second layer 174 is formed of a material having an etching rate lower than that of the first layer 172. For example, when the first layer 172 is formed of ZnO, the second layer 174 may be formed of ITO having an etching rate higher than that of ZnO. Namely, in a case in which the first layer 172 is formed of any material among ITO, ITZO, IO, SnO, ZnO, ISnO, IZO, IGO, GZO, and IGZO, the second layer 174 may be formed of a material having an etching rate lower than that of the first layer 172, in order to form the barrier rib 170.

The barrier rib 170 according to an embodiment of the present invention has an overall thickness equal to or greater than 0.3 μm, thicker than the bank layer 160. In a case in which the barrier rib 170 is configured to have double layers including the first layer 172 and the second layer 174, a thickness of the first layer 172 is 30% to 70% of the overall thickness of the barrier rib 170, and a thickness of the second layer 174 is 30% to 70% of the overall thickness of the barrier rib 170. This is to enhance adhesive strength between the barrier rib 170 and the auxiliary electrode 155 and reliability of the barrier rib 170 having a reversely tapered shape. Here, an external angle θ1 between a horizontal line L passing through a point where the first layer 172 and the auxiliary electrode 155 meet and the side of the first layer 172 may be 30 degrees or smaller, a tapered angle θ2 of the second layer 174 of the barrier rib 170 may be 30 degrees or smaller, or both the external angle θ1 between a horizontal line L passing through a point where the first layer 172 and the auxiliary electrode 155 meet and the side of the first layer 172 and the tapered angle θ2 of the second layer 174 of the barrier rib 170 may be 30 degrees or smaller. When the external angle θ1 between a horizontal line L passing through a point where the first layer 172 and the auxiliary electrode 155 meet and the side of the first layer 172 and the tapered angle θ2 of the second layer 174 of the barrier rib 170 are 30 degrees or smaller, the barrier 170 having the reversely tapered shape may be properly formed, and thus, the organic layer may be patterned during a follow-up organic layer deposition process.

Referring to FIG. 4, the barrier rib 170 may be configured as a triple-layer structure. The barrier rib 170 may have a triple-layer structure including a third layer 176 positioned in the lowermost portion, a first layer 172 positioned on the third layer 176, and a second layer 174 positioned on the first layer 172. The third layer 176 of the barrier rib 170, which is directly in contact with the auxiliary electrode 155 to form a lower portion of the barrier rib 170, may be formed of any one selected from among ITO, ITZO, IO, SnO, ZnO, ISnO, IZO, IGO, GZO, and IGZO. The first layer 172, which is positioned on the third layer 176 to form a middle portion of the barrier rib 170, is formed of any one selected from among ITO, ITZO, IO, SnO, ZnO, ISnO, IZO, IGO, GZO, and IGZO, and is formed of a material different from that of the third layer 176. The second layer 174, which is positioned on the first layer 172 to form the uppermost portion of the barrier rib 170, is formed of any one selected from among ITO, ITZO, IO, SnO, ZnO, ISnO, IZO, IGO, GZO, and IGZO, and is formed of a material different from that of the first layer 172.

In more detail, the barrier rib 170 composed of three layers has a reversely tapered shape, and may have a sandglass shape with wider uppermost and lowermost portions. Thus, the third layer 176 is formed of a material having an etching rate lower than that of the first layer 172 with respect to the same etching solution, the first layer 172 is formed of a material having an etching rate higher than that of the second layer 174 with respect to the same etching solution, and the second layer 174 is formed of a material having an etching rate smaller than that of the first layer 172. For example, when the third layer 176 is formed of ITO, the first layer 172 may be formed of IGZO having an etching rate higher than that of ITO and the second layer 174 may be formed of ITO having an etching rate higher than that of IGZO. Namely, in a case in which the third layer 176 is formed from any one among ITO, ITZO, IO, SnO, ZnO, ISnO, IZO, IGO, GZO, and IGZO. The first layer 172 may be formed of a material having an etching rate higher than that of the third layer 176 and the second layer 174 may be formed of a material having an etching rate lower than that of the first layer 172, to form the barrier rib 170. As discussed above, all the barrier ribs according to an embodiment of the present invention are formed of a conductive material, for example, a metal oxide. The barrier ribs 170, formed of a conductive material, may have excellent adhesive strength with respect to the auxiliary electrode 155 therebelow, thus being prevented from peeling, implementing a fine pattern, and being prevented from being damaged even at high temperatures, securing process stability.

The barrier rib 170 has an overall thickness equal to or greater than 0.3 μm, thicker than the bank layer 160. In a case in which the barrier rib 170 is composed of three layers including the third layer 176, the first layer 172, and the second layer 174, a thickness of the third layer 176 ranges from 10% to 50% of the overall thickness of the barrier rib 170, a thickness of the first layer 172 ranges from 10% to 50% of the overall thickness of the barrier rib 170, and a thickness of the second layer 174 ranges from 10% to 50% of the overall thickness of the barrier rib 170. This is to enhance adhesive strength between the barrier rib 170 and the auxiliary electrode 155 and reliability of the barrier rib 170 having a reversely tapered shape.

Here, an external angle θ1 between the first layer 172 and the horizontal line L may be 30 degrees or smaller, a tapered angle θ2 of the second layer 174 of the barrier rib 170 may be 30 degrees or smaller, or both the external angle θ1 between a horizontal line L passing through a point where the first layer 172 and the auxiliary electrode 155 meet and the side of the first layer 172 and the tapered angle θ2 of the second layer 174 of the barrier rib 170 may be 30 degrees or smaller. When the external angle θ1 between a horizontal line L passing through a point where the first layer 172 and the auxiliary electrode 155 meet and the side of the first layer 172 and the tapered angle θ2 of the second layer 174 of the barrier rib 170 are 30 degrees or smaller, the barrier 170 having the reversely tapered shape may be properly formed, and thus, the organic layer may be patterned during a follow-up organic layer deposition process.

As described above, in the organic light emitting display device according to an embodiment of the present invention, since the auxiliary electrode is provided, resistance of the second electrode is reduced and a driving voltage of an element can be lowered, facilitating increasing a size of the device, and generation of non-uniform brightness otherwise due to a non-uniform voltage based on resistance can be prevented. In addition, since the conductive barrier rib having a reversely tapered shape is provided on the auxiliary electrode, an organic layer may be formed without a mask, simplifying the manufacturing process, reducing manufacturing cost, and enhancing reliability of the barrier rib.

Hereinafter, a method for manufacturing an organic light emitting display device according to an embodiment of the present invention will be described. FIGS. 5A through 5D are cross-sectional views illustrating sequential processes of a method for manufacturing an organic light emitting display device according to an embodiment of the present invention. In the following descriptions, the same reference numerals will be used for the same components as those of FIG. 2 to facilitate understanding.

Figure 5A:
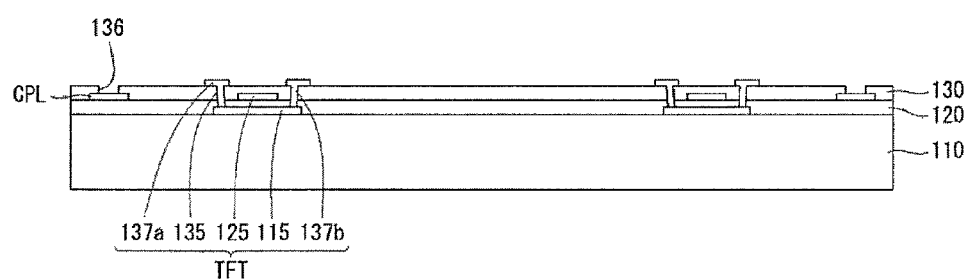
FIGS. 5A through 5D are cross-sectional views illustrating sequential processes of a method for manufacturing an organic light emitting display device according to an embodiment of the present invention.

First, referring to FIG. 5A, amorphous silicon (a-Si) is stacked on a substrate 100 formed of glass, plastic, or a conductive material, dehydrogenation is performed thereon, and a laser is subsequently irradiated to the amorphous silicon layer to crystallize the amorphous silicon layer to form a polycrystalline silicon layer. Thereafter, the polycrystalline silicon layer is patterned using a mask to form a semiconductor layer 115. Before the semiconductor layer 115 is formed, a buffer layer may be further formed. The buffer layer prevents impurities present on a surface of the substrate 110 from being eluted and spreading to the amorphous silicon layer during the crystallization process, and may be formed of a silicon oxide (SiOx), a silicon nitride (SiNx), or have a stacked structure of the silicon oxide (SiOx) and the silicon nitride (SiNx).

Subsequently, a gate insulating layer 120 is formed on the substrate 110 including the semiconductor layer 115. The gate insulating layer 120 may be formed of a silicon oxide (SiOx) or a silicon nitride (SiNx) or may be formed as a multi-layer. A gate electrode 125 may be formed in a region, corresponding to the semiconductor layer 115, of the gate insulating layer 120, and cathode power lines CPL are formed on both sides of the substrate 110. The gate electrode 125 and the cathode power lines CPL may be a monolayer formed of aluminum (Al), molybdenum (Mo), tungsten (W), titanium (Ti), or an alloy thereof, or may be a multi-layer of titanium/aluminum/titanium (Ti/Al/Ti).

Subsequently, an interlayer insulating layer 130 is formed on the substrate with the gate electrode 125 and the cathode power lines CPL formed thereon. The interlayer insulating layer 130 may be formed of a silicon oxide (SiOx) or a silicon nitride (SiNx), or may be formed as a multi-layer. Thereafter, the interlayer insulating layer 130 is etched to form first contact holes 135 exposing both sides of the semiconductor layer 115, and second contact holes 136 exposing the cathode power lines CPL. A source electrode 137a and a drain electrode 137b connected to the semiconductor layer 115 through the first contact holes 135 are formed, thus forming a TFT including the semiconductor layer 115, the gate electrode 125, the source electrode 137a, and the drain electrode 137b. The source electrode 137a and the drain electrode 137b may be a monolayer formed of aluminum (Al), molybdenum (Mo), tungsten (W), titanium (Ti), or an alloy thereof, or may be a multi-layer of titanium/aluminum/titanium (Ti/Al/Ti).

Figure 5B:
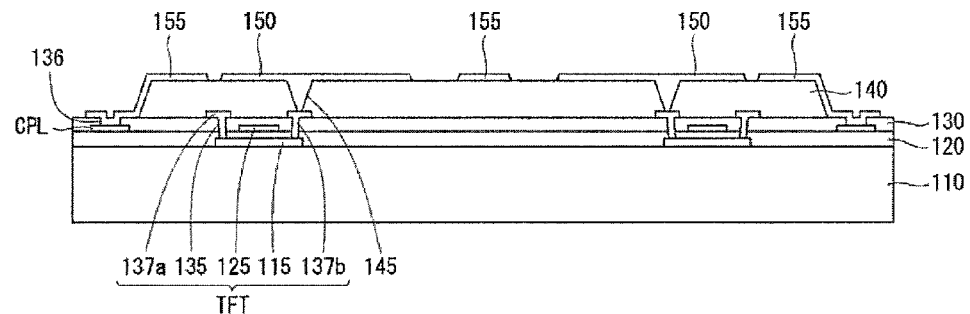

Subsequently, referring to FIG. 5B, a planarization layer 140 is formed on the substrate 110 with the TFT formed thereon. The planarization layer 140 may be formed of an organic material such as a benzocyclobutene (BCB)-based resin, an acrylic resin, a polyimide resin, and the like. Thereafter, the planarization layer 140 is patterned to form a via hole 145 exposing the drain electrode 137b of the TFT.

Subsequently, a material having a high work function such as ITO, IZO, or ZnO is stacked on the planarization layer 140 and the via hole 145 and patterned to form a first electrode 150 and an auxiliary electrode 155. The first electrode 150 fills the via hole 145 and is electrically connected to the drain electrode 137b, and the auxiliary electrode 155 is formed between the first electrodes 150 and spaced apart therefrom. Also, the auxiliary electrode 155 at an outer edge of the substrate 110 is formed along the planarization layer 140 and connected to the cathode power line CPL exposed by the second contact hole 136.

Figure 5C:
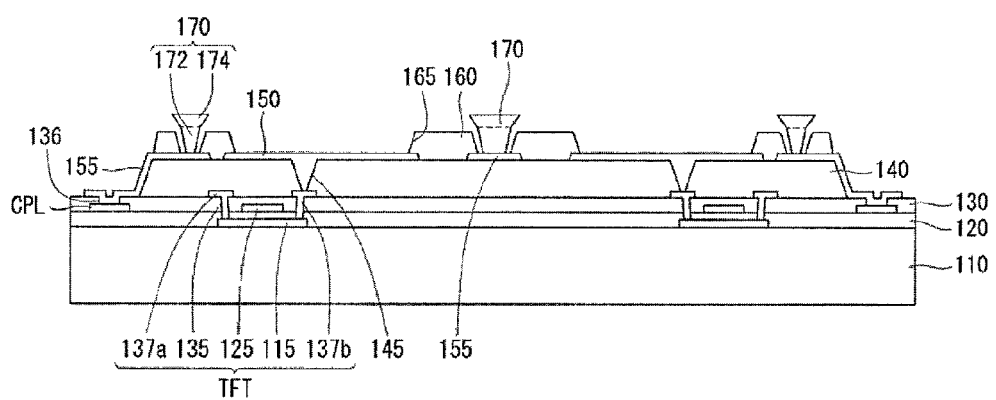

Subsequently, referring to FIG. 5C, a bank layer 160 is formed on the substrate 110 with the first electrode 150 and the auxiliary electrode 155 formed thereon. The bank layer 160 is formed of an organic material such as polyimide, a benzocyclobutene resin, acrylate, and the like. Thereafter, the bank layer 160 is patterned to form openings 165 exposing the first electrode 150 and the auxiliary electrode 155.

Thereafter, the barrier rib 170 is formed on the auxiliary electrode 155 exposed by the opening 165. In more detail, a first material selected from among ITO, ITZO, IO, SnO, ZnO, ISnO, IZO, IGO, GZO, and IGZO is stacked on the substrate 110 with the bank layer 160 formed thereon, a second material having an etching rate lower than that of the first material, selected from among ITO, ITZO, IO, SnO, ZnO, ISnO, IZO, IGO, GZO, and IGZO is stacked, which are then etched with an etching solution to form a barrier rib 170 including a first layer 172 positioned in a lower portion and a second layer 174 positioned on the first layer 172. Here, the first layer 172 having a relatively high etching rate with respect to the etching solution has been rapidly etched, while the second layer 174 having a relatively low etching rate has been slowly etched, the barrier rib 170 having a reversely tapered shape in which the second layer 174 having a width greater than that of the first layer 172 is manufactured. In the present embodiment, manufacturing of the barrier rib 170 having a dual-layer structure is described, but in the case of a barrier rib 170 having a triple-layer structure, a third material having an etching rate lower than that of the first material may be first stacked, a first material may be stacked, and a second material may subsequently be stacked, which are then etched with an etching solution to manufacturing the barrier rib 170 having a triple-layer structure. A thickness, a tapered angle, and the like, of the barrier rib 170 have been described above, so a detailed description thereof will be omitted.

Figure 5D:
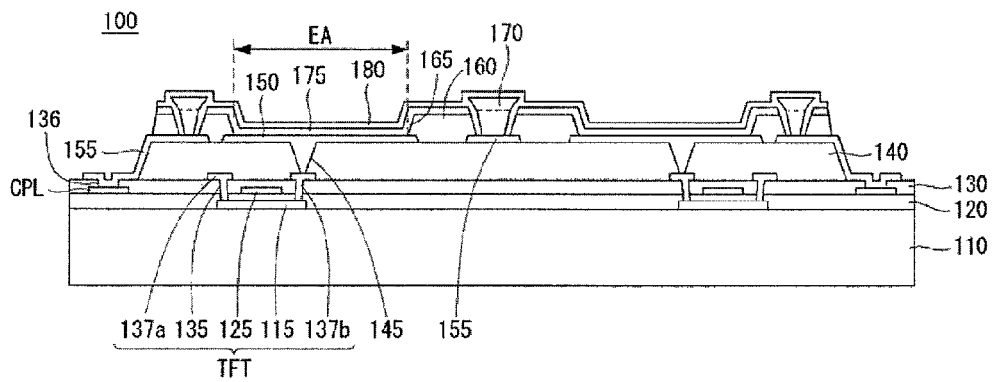

Thereafter, referring to FIG. 5D, an organic layer 175 is formed on the substrate with the barrier rib 170 formed thereon. The organic layer 175 is deposited on the first electrode 150, the bank layer 160, and the barrier rib 170 and patterned by the barrier rib 170 having the reversely tapered shape, but the organic layer 175 is not deposited on the auxiliary electrode 155 positioned below the barrier rib 170. The organic layer 175 may include at least one among a hole injection layer HIL, a hole transport layer HTL, an light emitting layer LEL, an electron transport layer ETL, and an electron injection layer EIL. For example, the organic layer 175 may be formed using evaporation.

Subsequently, a second electrode 180 is formed on the substrate 110 with the organic layer 175 formed thereon. The second electrode 180 is stacked on the organic layer 175, but unlike the organic layer 175, the second electrode 180 is stacked on the surface of the barrier rib 170 and stacked also on the auxiliary electrode 155. Thus, the second electrode 180 is electrically connected to the auxiliary electrode 155, and is connected to the auxiliary electrode 155 at an outer edge of the substrate 110 so as to be electrically connected to the cathode power line CPL. The second electrode 180 may be formed of magnesium (Mg), silver (Ag), aluminum (Al), calcium (Ca), or an alloy thereof. Accordingly, the organic light emitting display device 100 according to an embodiment of the present invention is manufactured.

Figure 6:
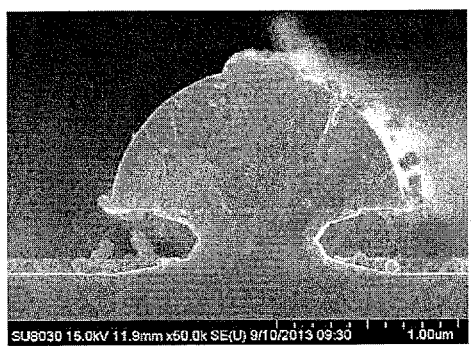
FIGS. 6 and 7 are images illustrating a barrier rib having a triple-layer structure manufactured according to an embodiment of the present invention.
Figure 7:
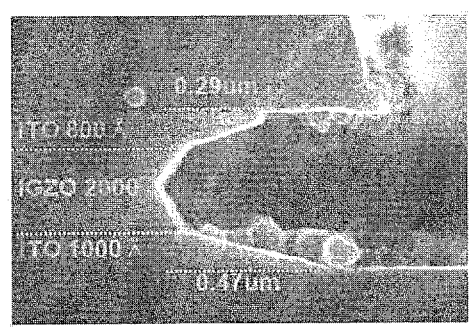

FIGS. 6 and 7 are images illustrating a barrier rib having a triple-layer structure manufactured according to an embodiment of the present invention. Referring to FIGS. 6 and 7, it can be seen that a triple-layer barrier rib having a ITO/IGZO/ITO structure in which ITO is formed in the lowermost portion, IGZO is formed on ITO, and ITO is positioned in the uppermost portion, is formed. Here, an overall thickness of the barrier rib is 3800 Å. Namely, the lowermost ITO layer has a thickness of 1000 Å, the IGZO layer has a thickness of 2000 Å, and the uppermost ITO layer has a thickness of 800 Å. Due to the difference in etching rates between ITO and IGZO layers, the IGZO layer having a higher etching rate is formed between the ITO layers having a lower etching rate, forming a barrier having a reversely tapered shape similar to a cross-section of a sandglass.

As described above, in the organic light emitting display device according to an embodiment of the present invention, since the auxiliary electrode is provided, resistance of the second electrode is reduced and a driving voltage of an element can be lowered, facilitating increasing a size of the device, and generation of non-uniform brightness otherwise due to a non-uniform voltage based on resistance can be prevented. In addition, since the conductive barrier rib having a reversely tapered shape is provided on the auxiliary electrode, an organic layer may be formed without a mask, simplifying the manufacturing process, reducing manufacturing cost, and enhancing reliability of the barrier rib.

Meanwhile, in the organic light emitting display device according to an embodiment of the present invention, if non-uniform brightness occurs due to resistance of the second electrode, the non-uniform brightness may be repaired using laser welding.

Figure 8:
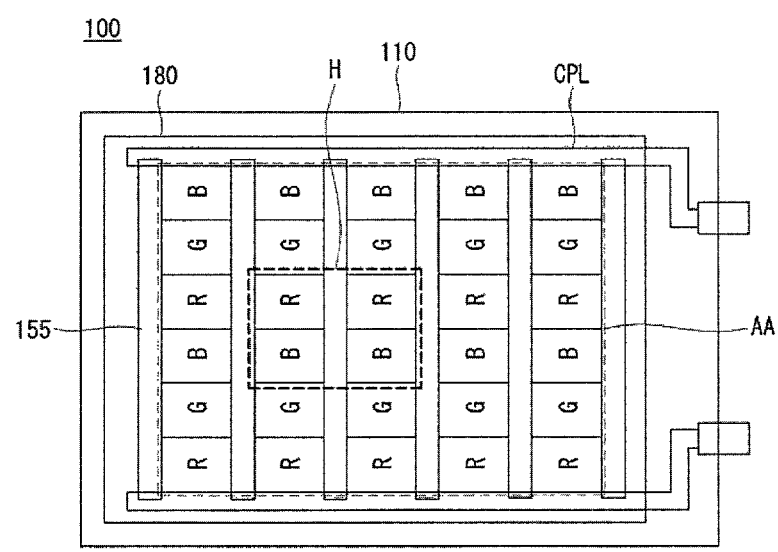
FIG. 8 is a plan view illustrating an organic light emitting display device according to an embodiment of the present invention.
Figure 9:
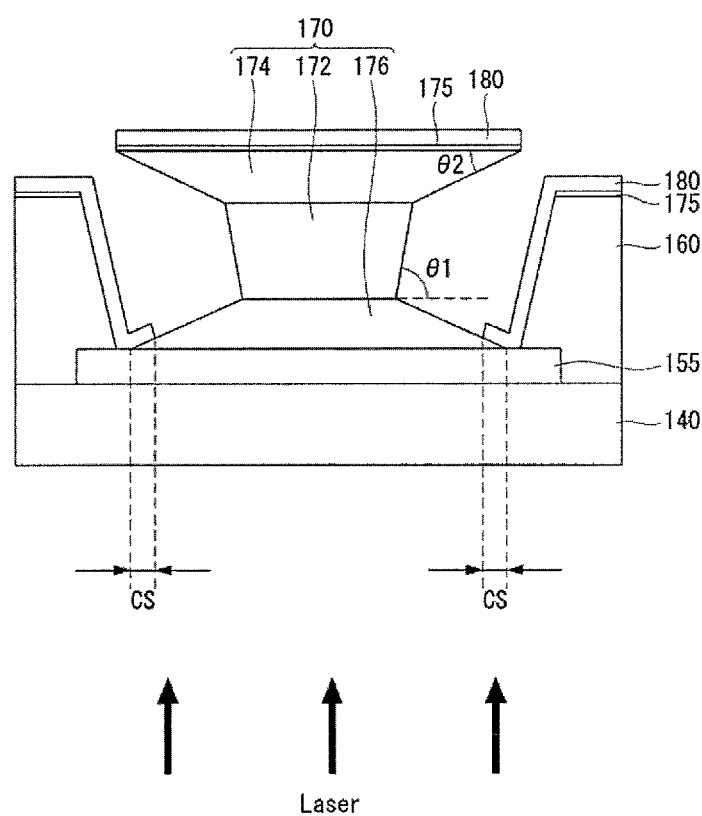
FIGS. 9 and 10 are cross-sectional views illustrating a contact region of an auxiliary electrode and a second electrode according to an embodiment of the present invention.
Figure 10:
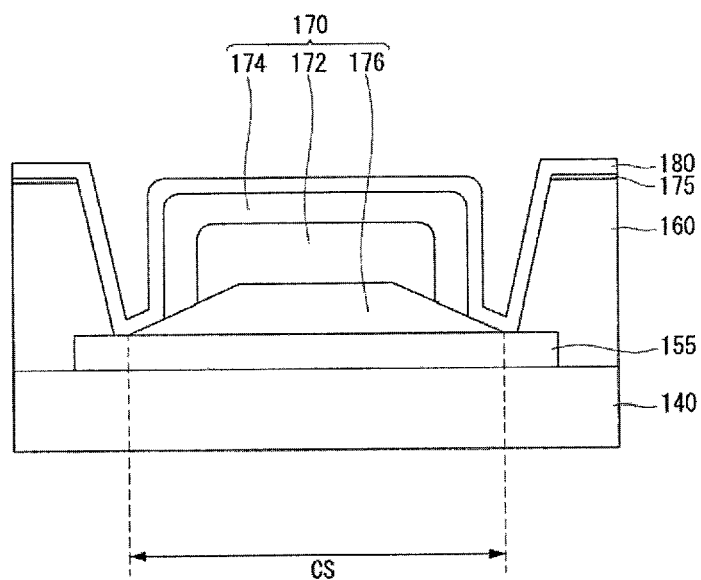

FIG. 8 is a plan view illustrating an organic light emitting display device according to an embodiment of the present invention, and FIGS. 9 and 10 are cross-sectional views illustrating a contact region of an auxiliary electrode and a second electrode according to an embodiment of the present invention.

Referring to FIG. 8, in an organic light emitting display device 100 according to an embodiment of the present invention, an active area AA is demarcated in a substrate 110, and a plurality of red (R), green (G), and blue (B) pixels are formed in the active area AA. The plurality of pixels each includes a first electrode and a second electrode 180 as a cathode electrode facing the first electrode. Cathode power lines CPL supplying a low potential voltage to the second electrode 180 are positioned on both sides of the active area AA, and auxiliary electrodes 155 are provided to prevent an increase in resistance of the second electrode 180.

Non-uniform brightness may occur due to resistance of the second electrode 180 in a partial region of the organic light emitting display device 100. As illustrated in FIG. 8, a non-uniform brightness region H in which brightness is not uniform in a partial region is present. When the non-uniform brightness region H is present in the organic light emitting display device 100, display quality is lowered to degrade reliability. In an embodiment of the present invention, the non-uniform brightness of the organic light emitting display device 100 may be repaired using laser welding as described hereinafter. Meanwhile, in FIG. 8, it is illustrated that the active area AA includes 30 pixels and the non-uniform brightness region H is large, but this is merely exaggerated to help understanding of the present invention and the present invention is not limited thereto.

Referring to FIG. 9, a structure of the portion of the barrier rib 170 where the non-uniform brightness region H is present will be described. The barrier rib 170 is positioned on the auxiliary electrode 155. The barrier rib 170 has a triple-layer structure including a third layer 176 positioned in the lowermost portion, a first layer 172 positioned on the third layer 176, and a second layer 174 positioned on the first layer 172. Details of the barrier rib 170 have been described above, so a description thereof will be omitted.

As for a structure of the second electrode 180 formed in the portion of barrier rib 170 in the non-uniform brightness region H, the second electrode 180 formed on the bank layer 160 is in contact with portions of the auxiliary electrode 155 and the third layer 176 and is not in contact with the lateral surfaces of the second layer 174 and the first layer 172 of the barrier rib 170. Thus, the second electrode 180 positioned on the second layer 174 of the barrier rib 170 and the second electrode 180 formed on the bank layer 160 are separated. This structure is generated due to low deposition uniformity of the second electrode 180. In this instance, a contact area CS of the second electrode 180 formed on the bank layer 160 with the barrier rib 170 having conductivity is so small that resistance of the second electrode 180 is increased. Thus, the region of the second electrode 180 having increased resistance appears as the non-uniform brightness region H in which non-uniform brightness occurs.

In an embodiment of the present invention, a laser is irradiated to the barrier rib 170 positioned within the non-uniform brightness region H to melt a partial layer of the barrier rib 170 to increase the contact area CS between the second electrode 180 and the barrier rib 170 to thereby reduce resistance of the second electrode 180.

In more detail, a laser is irradiated to the barrier rib 170 positioned within the non-uniform brightness region H. Here, the laser may be irradiated from a lower side of the substrate 110 toward the barrier rib 170, may be irradiated from an upper side of the barrier rib 170 toward the barrier rib 170, or may be irradiated from both sides of the barrier rib 170. The laser may be irradiated in any direction as long as it can melt the barrier rib 170. As for laser irradiation conditions, a source, a focal point, power, an irradiation time, and the like, may be appropriately adjusted and used to generate a laser, and any laser may be used as long as it can melt the second layer 174 of the barrier rib 170. Here, however, in order to minimize an influence on an element such as the TFT, or the like, of the organic light emitting display device, an irradiation temperature of the laser may be adjusted to be equal to or lower than 350° C. Also, in order to repair non-uniform brightness of the organic light emitting display device 100, a layer may be irradiated to every barrier rib 170 positioned within the non-uniform brightness region H. However, the present invention is not limited thereto and a laser may also be irradiated even to barrier ribs 170 which are not positioned within the non-uniform brightness region H but in close proximity thereto.

Referring to FIG. 10, a final structure of thee barrier rib 170 to which a laser has been irradiated is illustrated. When a laser is irradiated to the barrier rib 170, the second layer 174 positioned in the uppermost portion of the barrier rib 170 is melted down by the laser, and the organic layer 175 is melted and removed. The second layer 174 formed of any one selected from among ITO, ITZO, IO, SnO, ZnO, ISnO, IZO, IGO, GZO, and IGZO is melted down to the auxiliary electrode 155 and the third layer 176 according to laser irradiation. The first layer 172 of the barrier rib 170 is partially melted but does not flow down. The laser irradiation is performed until the second layer 174 is melted down to cover both the auxiliary electrode 155 and the third layer 176. Accordingly, the second layer 174 covers the first layer 172 and the third layer 176 of the barrier rib 170. When the second layer 174 of the barrier rib 170 is melted down by the laser irradiation, the second electrode 180 positioned on the second layer 174 is melted down to a degree so as to be connected to the second electrode 180 adjacent thereto. Accordingly, the contact area CS in which the second electrode 180 is in contact with the barrier rib 170 can be remarkably enhanced, reducing resistance of the second electrode 180, to thus repair the generated non-uniform brightness.

As described above, in the organic light emitting display device according to an embodiment of the present invention, since the auxiliary electrode is provided, resistance of the second electrode is reduced and a driving voltage of an element can be lowered, facilitating increasing a size of the device, and generation of non-uniform brightness otherwise due to a non-uniform voltage based on resistance can be prevented. In addition, since the conductive barrier rib having a reversely tapered shape is provided on the auxiliary electrode, an organic layer may be formed without a mask, simplifying the manufacturing process, reducing manufacturing cost, and enhancing reliability of the barrier rib. In addition, when non-uniform brightness occurs, a contact area with the auxiliary electrode is increased by melting the conductive barrier, whereby the region with the non-uniform brightness can be repaired.

Although embodiments have been described with reference to a number of illustrative embodiments thereof, it should be understood that numerous other modifications and embodiments can be devised by those skilled in the art that will fall within the scope of the principles of this invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. An organic light emitting display device comprising:
    a substrate;
    two or more first electrodes positioned on the substrate and spaced apart from one another;
    an auxiliary electrode positioned between the first electrodes;
    a barrier rib positioned on the auxiliary electrode and having a reversely tapered structure including at least two layers;
    a bank layer exposing portions of the first electrodes to define a light emission region;
    an organic layer positioned in the light emission region and patterned by the barrier rib; and
    a second electrode positioned on the organic layer and the barrier rib, and disposed to be in contact with the auxiliary electrode,
    wherein in a region of non-uniform brightness in the organic light emitting display device, the barrier rib is melted by irradiating a laser to increase electrical contact between the second electrode and the auxiliary electrode.

2. The organic light emitting display device of claim 1, wherein the barrier rib comprises a first layer formed of a material having a relatively high etching rate and a second layer positioned on the first layer and formed of a material having an etching rate lower than that of the first layer.

3. The organic light emitting display device of claim 1, wherein the barrier rib comprises a first layer formed of a material having a relatively high etching rate, a second layer positioned on the first layer and formed of a material having an etching rate lower than that of the first layer, and a third layer positioned below the first layer and formed of a material having an etching rate lower than that of the first layer.

4. The organic light emitting display device of claim 1, wherein the barrier rib includes materials of at least two or more selected from among ITO, ITZO, JO, SnO, ZnO, ISnO, IZO, IGO, GZO, and IGZO.

5. The organic light emitting display device of claim 2, wherein a thickness of the first layer ranges from 30% to 70% of the overall thickness of the barrier rib, and a thickness of the second layer ranges from 30% to 70% of the overall thickness of the barrier rib.

6. The organic light emitting display device of claim 3, wherein a thickness of the first layer ranges from 10% to 50% of the overall thickness of the barrier rib, and thicknesses of the second layer and the third layer range from 10% to 50% of the overall thickness of the barrier rib, respectively.

7. The organic light emitting display device of claim 2, wherein an external angle between a horizontal line passing through a point where the first layer and the auxiliary electrode meet and the side of the first layer is 30 degrees or smaller, and a tapered angle of the second layer is 30 degrees or smaller.

8. The organic light emitting display device of claim 3, wherein an external angle between a horizontal line passing through a point where the first layer and the auxiliary electrode meet and the side of the first layer is 30 degrees or smaller, and a tapered angle of the second layer is 30 degrees or smaller.

9. The organic light emitting display device of claim 2, wherein an external angle between a horizontal line passing through a point where the first layer and the auxiliary electrode meet and the side of the first layer, or a tapered angle of the second layer is 30 degrees or smaller.

10. The organic light emitting display device of claim 3, wherein an external angle between a horizontal line passing through a point where the first layer and the auxiliary electrode meet and the side of the first layer, or a tapered angle of the second layer is 30 degrees or smaller.

11. The organic light emitting display device of claim 1, further comprising thin film transistors each including a gate electrode, a semiconductor layer, a source electrode, and a drain electrode between the substrate and the first electrodes.

12. An organic light emitting display device comprising:
    a substrate;
    two or more first electrodes positioned on the substrate and spaced apart from one another;
    an auxiliary electrode positioned between the first electrodes;
    a barrier rib positioned on the auxiliary electrode and including at least two layers;
    a bank layer exposing portions of the first electrodes to define a light emission region; and
    a second electrode continuously positioned on the barrier rib, and disposed to be in contact with the auxiliary electrode, wherein the barrier rib comprises a third layer, a first layer positioned on the third layer, and a second layer positioned on the first layer, wherein the second layer entirely covers the first layer and the second layer is in direct contact with a sidewall of the first layer.

13. The organic light emitting display device of claim 12, wherein the second layer of the barrier rib is in contact with the third layer.

14. The organic light emitting display device of claim 13, wherein a third layer of the barrier rib is in contact with the auxiliary electrode.

15. The organic light emitting display device of claim 12, wherein the barrier rib has a reversely tapered structure.

16. A method for repairing an organic light emitting display device including a substrate, a plurality of first electrodes positioned on the substrate and spaced apart from one another, an auxiliary electrode positioned between the first electrodes, a barrier rib positioned on the auxiliary electrode and having a reversely tapered structure including at least two layers, a bank layer exposing portions of the first electrodes to define a light emission region, an organic layer positioned in the light emission region and patterned by the barrier rib, and a second electrode positioned on the organic layer, spaced apart from the barrier rib, and disposed to be in contact with the auxiliary electrode, the method comprising:

irradiating a laser to the barrier rib and the second electrode positioned on the barrier rib, wherein the laser melts portions of the barrier rib and portions of the second electrode to cause the second electrode to form a continuous film from an upper surface of the organic layer to an upper surface of the barrier rib.

17. The method of claim 16, wherein the barrier rib comprises at least two or more layers, and at least one layer of the at least two or more layers of the barrier rib, starting from the uppermost portion of the barrier rib, is melted by the laser.

18. The method of claim 17, wherein when the laser is irradiated to the barrier rib and the second electrode, the at least one layer positioned in the uppermost portion of the barrier rib and the second electrode are melted down and the organic layer positioned between the barrier rib and the second electrode is removed.

19. The method of claim 16, wherein the barrier rib comprises at least three layers, and at least one layer of the at least three layers of the barrier rib, starting from the uppermost portion of the barrier rib, is melted by the laser to cover two of the at least three layers and increase a contact area between the second electrode and the auxiliary electrode.

20. The method of claim 16, wherein the irradiating of the laser to the barrier rib to melt portions of the barrier rib and the second electrode positioned on the barrier rib is controlled to only melt portions of the barrier rib corresponding to regions of non-uniform brightness in the organic light emitting display device.

* * * * *